(12) United States Patent
Sunder et al.

(10) Patent No.: US 12,007,432 B2
(45) Date of Patent: Jun. 11, 2024

(54) ENHANCED DIRECT CURRENT (DC) BUILT-IN-SELF-TEST (BIST) COVERAGE FOR OPTICAL ENGINES AND ADVANCED PACKAGING

(71) Applicant: Cisco Technology, Inc., San Jose, CA (US)

(72) Inventors: Sanjay Sunder, Allentown, PA (US); Alexander C. Kurylak, Bethlehem, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/813,203

(22) Filed: Jul. 18, 2022

(65) Prior Publication Data

US 2024/0019485 A1 Jan. 18, 2024

(51) Int. Cl.
*G01R 31/28* (2006.01)
(52) U.S. Cl.
CPC ..... *G01R 31/2853* (2013.01); *G01R 31/2856* (2013.01)
(58) Field of Classification Search
CPC ............ G01R 31/2879; G01R 31/2856; G01R 27/16; G01R 31/263; G01R 33/0094; G01R 33/26; G06F 3/042; G06F 21/44; G06F 3/0304; H01L 27/14643; H01L 25/167; H01L 27/1461; H01L 27/0248; H01L 27/14636
See application file for complete search history.

(56) References Cited

U.S. PATENT DOCUMENTS

| | | | |
|---|---|---|---|
| 6,363,044 B1 * | 3/2002 | Lehr | H01S 5/06825 369/53.22 |
| 9,960,844 B1 | 5/2018 | Raj et al. | |
| 9,960,888 B2 * | 5/2018 | Gloeckner | H04B 10/40 |
| 10,241,150 B2 * | 3/2019 | Woo | H01L 22/34 |
| 2016/0291086 A1 | 10/2016 | Chou et al. | |
| 2017/0373651 A1 | 12/2017 | Hutchins et al. | |
| 2019/0327036 A1 | 10/2019 | Gloeckner et al. | |
| 2021/0067105 A1 | 3/2021 | Kurylak et al. | |
| 2021/0215754 A1 | 7/2021 | Sunder et al. | |

FOREIGN PATENT DOCUMENTS

CN 113865827 A 12/2021

* cited by examiner

*Primary Examiner* — Vinh P Nguyen
(74) *Attorney, Agent, or Firm* — Patterson + Sheridan, LLP

(57) ABSTRACT

Techniques for testing connectivity between a first integrated circuit (IC) and a second IC of an electronics package are described. An example technique involves controlling a switch(es) in the first IC to configure a bias direction of a photodiode of the second IC to forward biased. A connectivity test between the first and second ICs is performed, when the photodiode is forward biased. Another technique involves controlling a switch(es) in the first IC to configure a bias direction of a photodiode in the second IC to reverse biased. A first voltage is measured at an input of a transimpedance amplifier (TIA) in the first IC when the photodiode is reverse biased. The switch(es) are controlled to change the bias direction of the photodiode to forward biased. A second voltage is measured at the input of the TIA when the photodiode is forward biased.

20 Claims, 8 Drawing Sheets

ENHANCED DIRECT CURRENT (DC) BUILT-IN-SELF-TEST (BIST) COVERAGE FOR OPTICAL ENGINES AND ADVANCED PACKAGING

TECHNICAL FIELD

Embodiments presented in this disclosure generally relate to integrated circuit testing. More specifically, embodiments described herein relate to verifying chip-to-chip connectivity in advanced electronic packaging.

BACKGROUND

Many advanced electronic packages include multiple integrated circuits (ICs). For example, a photonics package may include an electrical IC and a photonics IC. For certain applications, testing the connections between ICs in advanced electronic packaging can be costly. For example, high density applications, such as in-package optics (IPO) and optical engines, typically use expensive optical modules, such as laser diodes, fiber attach units and other discrete optical components to perform chip-to-chip connectivity testing. However, if a fault is detected after the optical components are assembled into the package, then the package and the optical components are discarded, resulting in severe waste.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
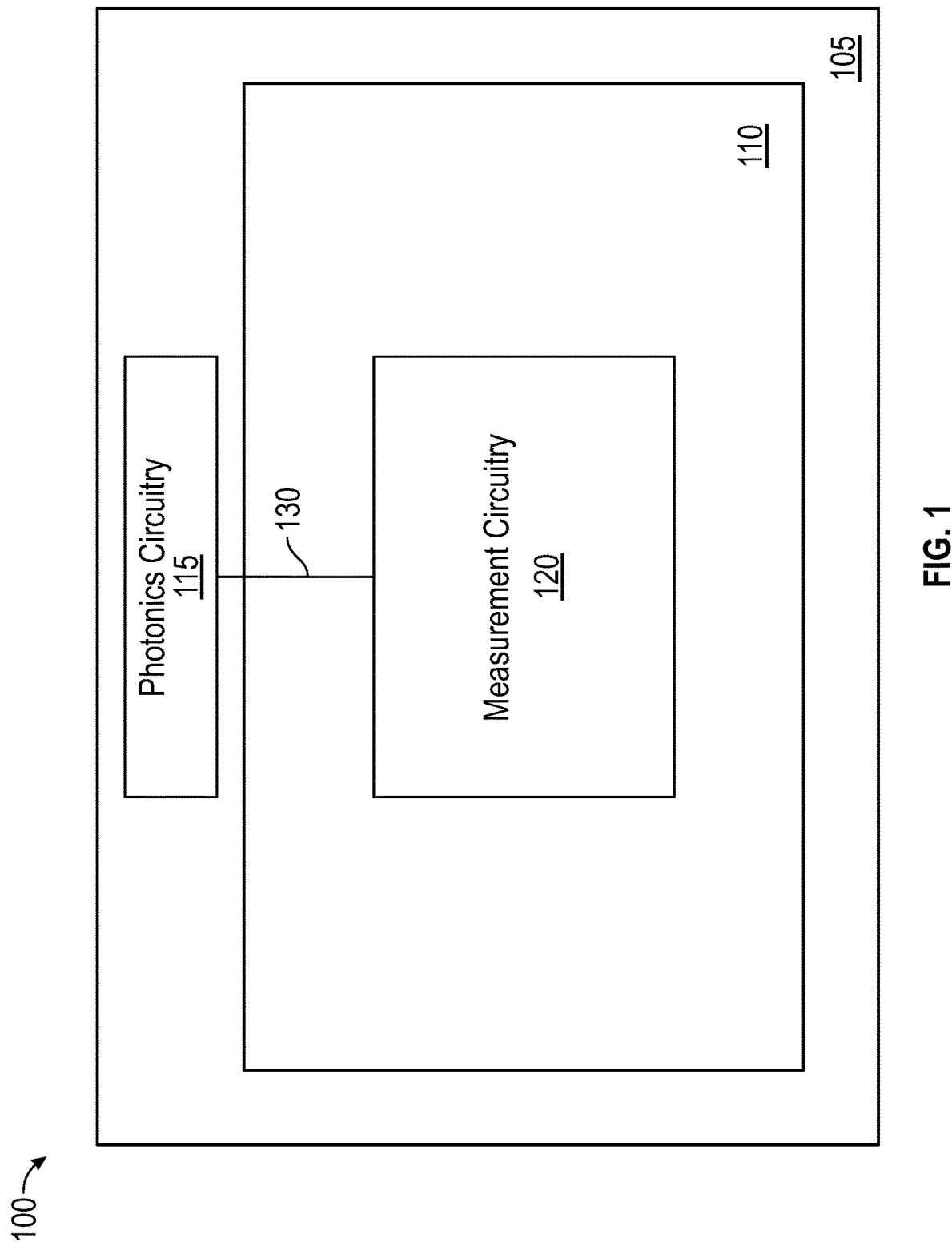
FIG. 1 is a top view of an example electronics package, according to one embodiment.

One embodiment presented in this disclosure is a method for testing connectivity between a first integrated circuit (IC) and a second IC of an electronics package. The method includes controlling one or more switches in the first IC to configure a bias direction of a photodiode of the second IC to forward biased. The method also includes performing a connectivity test between the first IC and the second IC, when the photodiode is forward biased.

Another embodiment presented in this disclosure is a method for testing connectivity between a first integrated circuit (IC) and a second IC of an electronics package. The method includes controlling one or more switches in the first IC to configure a bias direction of a photodiode in the second IC to reverse biased. The method also includes measuring a first voltage at an input of a transimpedance amplifier (TIA) in the first IC when the photodiode is reverse biased. The method also includes controlling the one or more switches in the first IC to change the bias direction of the photodiode from reverse biased to forward biased. The method also includes measuring a second voltage at the input of the TIA in the first IC when the photodiode is forward biased. The method further includes determining whether a fault has occurred with at least one of the first IC or the second IC based on the first and second voltages.

Another embodiment presented in this disclosure is an apparatus. The apparatus includes a first integrated circuit (IC) and a second IC. The first IC includes measurement circuitry. The second IC includes a photodiode. The measurement circuitry is adapted to configure a bias direction of the photodiode of the second IC to forward biased. The measurement circuitry is also adapted to perform a connectivity test between the first IC and the second IC, when the photodiode is forward biased.

EXAMPLE EMBODIMENTS

Direct current (DC) connectivity verification generally involves testing the connectivity between multiple ICs (or chips) in electronic packaging. For example, in many photonics packages, an electrical IC is generally mounted onto a photonics IC. In this example, DC connectivity verification may involve testing the connectivity between the electrical IC and photonics IC.

Conventional testing approaches generally use expensive optical assemblies, such as fibers, laser sources or optical signal generators in order to test the connectivity between the electrical IC and photonics IC. For example, the optical assembly is used to send light into a photodiode on the photonics IC, the current coming out of the photodiode is measured, and the connectivity is determined based on the measured current. Currently, there has been a transition towards high density applications, such as IPO and optical engines, which generally implies the use of more expensive optical modules. Accordingly, it may be desirable to provide techniques for performing chip-to-chip connectivity testing that can be performed at earlier stages of product testing and qualification and that are cost-effective.

Embodiments described herein provide techniques for performing DC connectivity testing between electrical and photonics ICs. In one embodiment, a built-in-self-test (BIST) is provided that can perform DC connectivity testing between (i) a photodiode (of a photonics IC) and electrical current sense circuitry (of an electrical IC) or (ii) a photodiode (of a photonics IC) and one or more transimpedance amplifiers (TIAs) (of an electrical IC).

The BIST described herein can allow for DC connectivity testing without the use of any optics for testing the datapath. For example, embodiments can perform DC connectivity testing before expensive optical assembly components, such as fibers, laser sources or optical signal generators are assembled. As such, the BIST provides a technical improvement to DC chip-to-chip connectivity testing by allowing for performing DC chip-to-chip connectivity testing at earlier stages of product testing (prior to assembling expensive optics). For example, embodiments can be used for testing during at least one manufacturing stage, such as chip-on-wafer (CoW), fanout packaging, chip on chip on substrate testing, in-package optics (IPO) stage or even at finished module.

Additionally, by allowing for DC connectivity testing without the use of expensive optics (e.g., laser diodes, fiber attach units and other discrete optical components), embodiments can provide a significant reduction in the cost associated with performing DC connectivity testing. For example, the cost of discarding defective parts during initial package testing prior to assembling expensive optics can provide a significant cost savings.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element 8 or that other elements may be connected between elements A and 8 (i.e., that element A is indirectly connected with element 8). In the case of electrical components, the term "connected with" may also be used herein to mean that a wire, trace, or other electrically conductive material is used to electrically connect elements A and 8 (and any components electrically connected there between).

FIG. 1 is a top down view of an electronics package 100 (also referred to as electronics packaging), according to one embodiment. In one embodiment, the electronics package 100 is a multi-chip package. For example, the electronics package 100 includes an IC (or chip) 105 and an IC (or chip) 110. As shown, the IC 110 is disposed on (or above) the IC 105. In one embodiment, the electronics package 100 can be used for an optical transceiver application. For example, the IC 110 can include the (main) electronics IC and the IC 105 may include one or more optical components.

As shown in this embodiment, the IC 110 includes measurement circuitry 120 and the IC 105 includes photonics circuitry 115. The measurement circuitry 120 is coupled to the photonics circuitry 115 via a path 130. The measurement circuitry 120 is generally configured to test DC connectivity between the IC 110 and the IC 105. In certain embodiments, the measurement circuitry 120 implements a BIST to measure current along the path 130 in order to test the DC connectivity between the IC 110 and the IC 105.

In one embodiment described below, the measurement circuitry 120 includes a current mirror circuit and a cathode bias selection circuit. In this embodiment, the measurement circuitry 120 uses the current mirror circuit and cathode bias selection circuit to test DC connectivity between the measurement circuitry 120 and a photodiode within the photonics circuitry 115. For example, as described below, the measurement circuitry 120 can use these components to change a bias direction of the photodiode from reverse biased to forward biased and to determine a measure of connectivity between the measurement circuitry and the photodiode.

In one embodiment described below, the measurement circuitry 120 includes a transimpedance amplifier (TIA). In this embodiment, the measurement circuitry 120 uses the TIA to test DC connectivity between the TIA and a photodiode within the photonics circuitry 115. For example, the measurement circuitry 120 may perform a first measurement of the connectivity when no photodiode current flows from the TIA thorough the photodiode (e.g., the photodiode is reverse-biased) and may perform a second measurement of the connectivity when photodiode current flows from the TIA through the photodiode (e.g., the photodiode is forward-biased). The measurement circuitry 120 may determine a measurement of connectivity between the TIA and the photodiode based on the first measurement and the second measurement.

In this manner, the measurement circuitry 120 allows for performing DC connectivity between (i) a photodiode (of a photonics IC) and electrical current sense circuitry (of an electrical IC) or (ii) a photodiode (of a photonics IC) and one or more transimpedance amplifiers (TIAs) (of an electrical IC), without the use of an optical assembly.

Figure 2A:
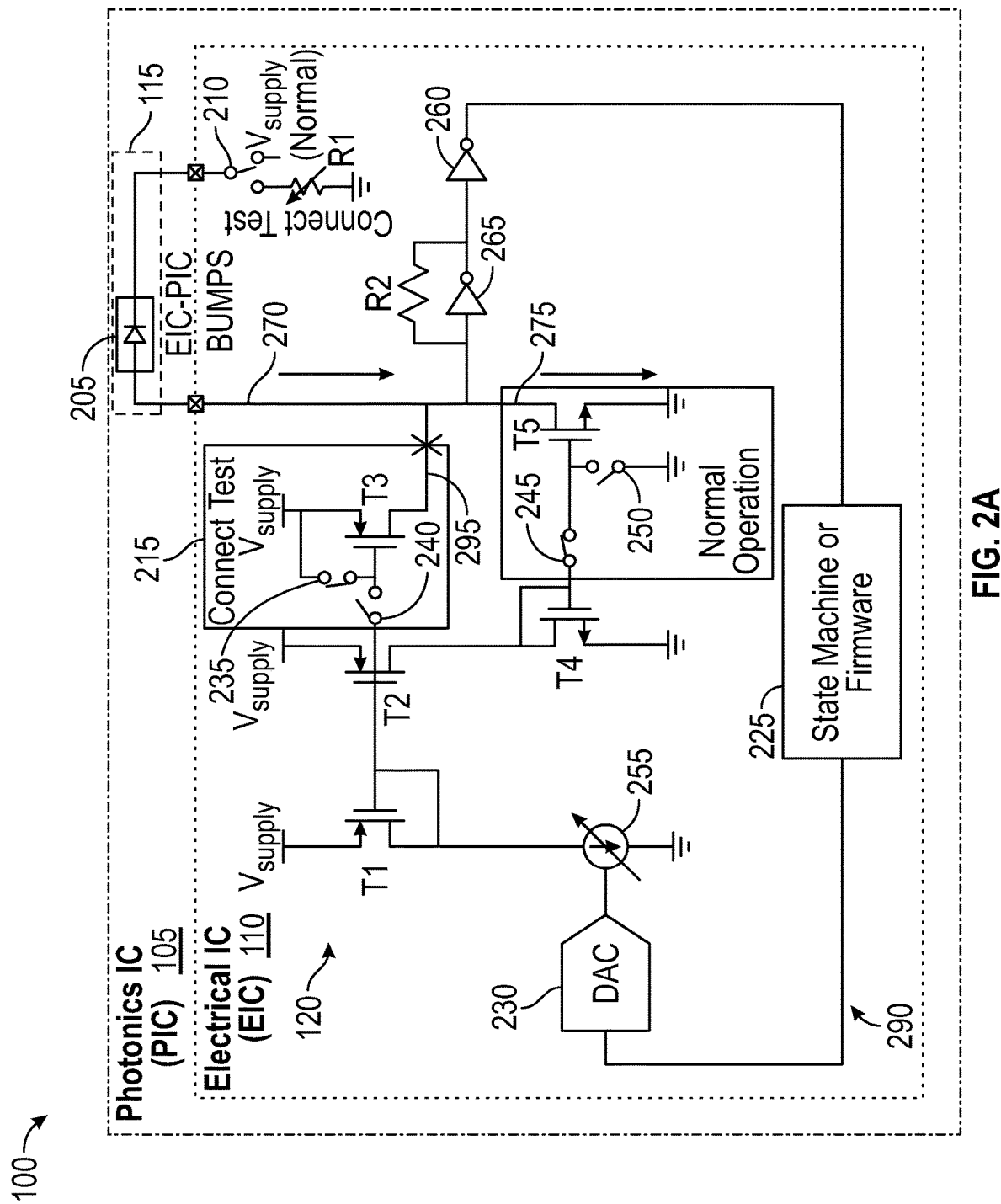
FIG. 2A further illustrates components of the electronics package, described relative to FIG. 1, in an operating mode, according to one embodiment.
Figure 2B:
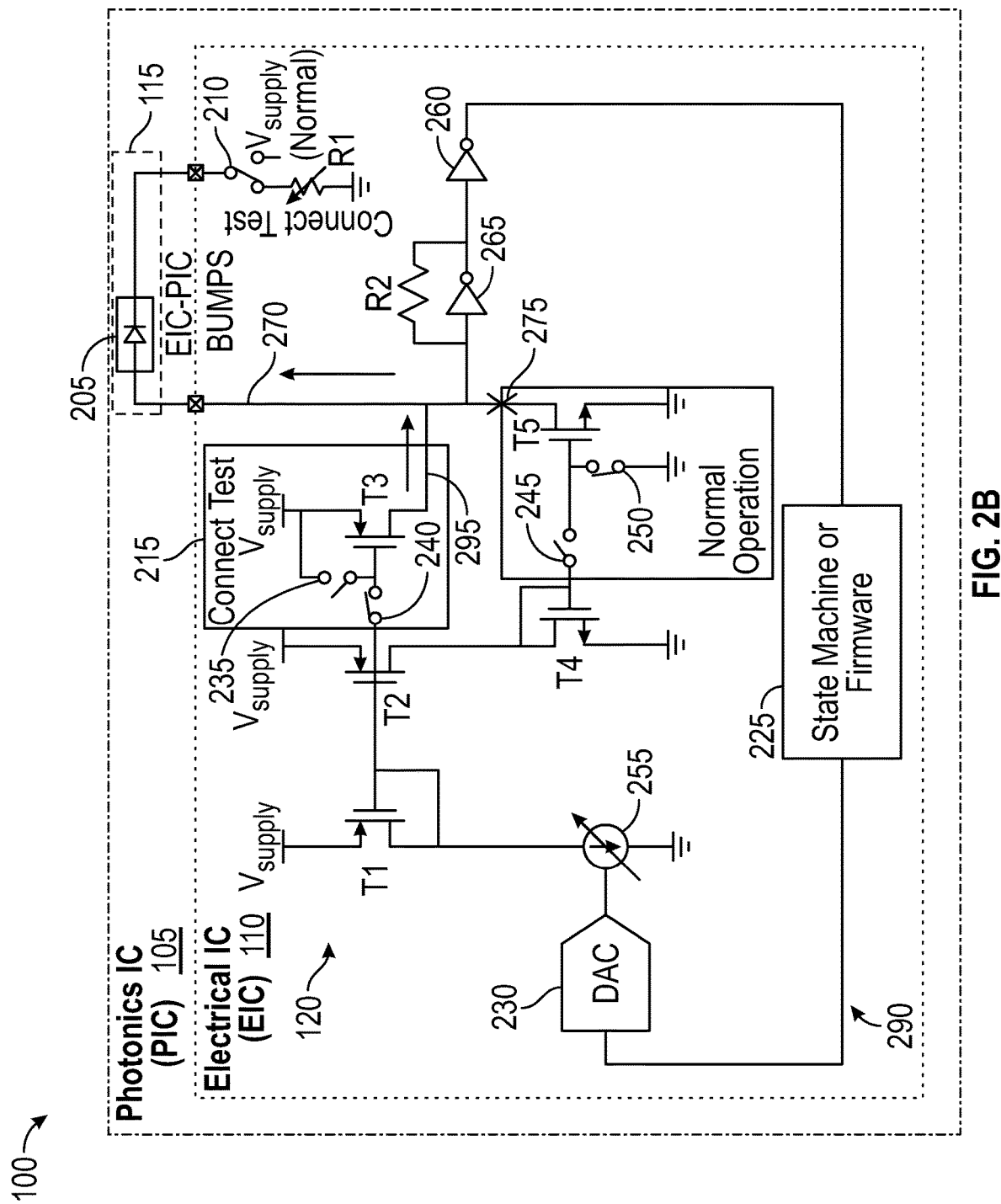
FIG. 2B further illustrates components of the electronics package, described relative to FIG. 1, in another operating mode, according to one embodiment.

FIGS. 2A-2B further illustrate components of the electronics package 100, described relative to FIG. 1, according to one embodiment. In particular, FIGS. 2A-2B illustrate components of measurement circuitry 120 (of the IC 110) and photonics circuitry 115 (of the IC 105), according to one embodiment.

In one embodiment, the measurement circuitry 120 is implemented as a current measurement block. As shown, the electronics package 100 includes a flow path 270, a flow path 275, and a flow path 295, which can be tested to ensure connectivity between the IC 105 and IC 110 of the electronics package 100. The flow paths 270, 275, and 295 are associated with a test loop 290, which includes various circuit elements, including, for example, transistors, inverters, resistors, current source, state machine, etc. In the embodiment depicted in FIGS. 2A-2B, the test loop 290 includes a digital-to-analog converter (DAC) 230, a current source 255, transistors T1-T5, resistors R1-R2, and inverters 260, 265. The test loop 290 (including the various circuit elements) may be under control of the state machine 225. When implemented as a current measurement block, the input code of the DAC 230 may converge at the point to where the current that flows out of the current measurement block is equal to what is being sunk by the photodiode 205 of the photonics circuitry 115.

In certain embodiments, the measurement circuitry 120 is configured to implement multiple modes of operation. As shown, the measurement circuitry 120 includes switches 210, 235, 240, 245, and 250 and a circuit 215, which may be configured to allow for different modes of operation. In the embodiment depicted in FIG. 2A, the measurement circuitry 120 is configured to implement a mission mode operation (e.g., normal operation) for measuring current from the photodiode 205 when the photodiode 205 is in reverse bias. For example, in mission mode operation, the current flows when an optical signal is applied to the photodiode 205 and this current can be a direct measure of optical power (incident on the photodiode 205 in reverse bias). As shown, in mission mode operation, the measurement circuitry 120 is configured to measure current via flow path 275. That is, the switches 210, 235, 240, 245, and 250 may be controlled (e.g., opened or closed) (via state machine or firmware 225), such that the photodiode 205 is reversed biased and the test loop 290 settles to a current that is measuring the reverse bias. In particular, switch 210 (which is used as a cathode bias selection switch) is coupled to $V_{supply}$, switches 235 and 245 are closed, and switches 240 and 250 are opened. When the switches 210, 235, 240, 245, and 250 are controlled (or selected) in this manner, the test loop 290 converges to the reverse biased photodiode current in flow path 270 balanced with the current in flow path 275. For example, the converged DAC code is the digital value of current through the photodiode 205 in reverse bias.

In another embodiment, the measurement circuitry 120 may be configured to implement a DC connectivity test. FIG. 2B illustrates an example in which the measurement circuitry 120 is configured to implement a DC connectivity test, according to certain embodiments. In contrast to the measurement circuitry 120 depicted in FIG. 2A, the switches 210, 235, 240, 245, and 250 of the measurement circuitry 120 depicted in FIG. 2B may be controlled (e.g., opened or closed) (via state machine or firmware 225), such that the photodiode 205 is forward biased and the test loop 290 settles to a current that is measuring the forward bias. In particular, switch 210 (which is used as a cathode bias selection switch) is coupled to a reference potential via R1, switches 235 and 245 are opened, and switches 240 and 250 are closed. When the switches 210, 235, 240, 245, and 250 are controlled (or selected) in this manner, the test loop 290 converges to the forward biased photodiode current in flow path 270 balanced with the current in flow path 295. For example, the converged DAC code is the digital value of current through the photodiode 205 in forward bias.

In one embodiment, the cathode bias of the photodiode 205 may be changed from a high voltage (e.g., Vsupply) to a low voltage (e.g., reference potential) when the photodiode 205 is forward biased (e.g., as a result of switch 210 being coupled to the reference potential). In one embodiment, the resistor R1 may be a programmable resistor, which can be used to limit the forward current.

Figure 3:
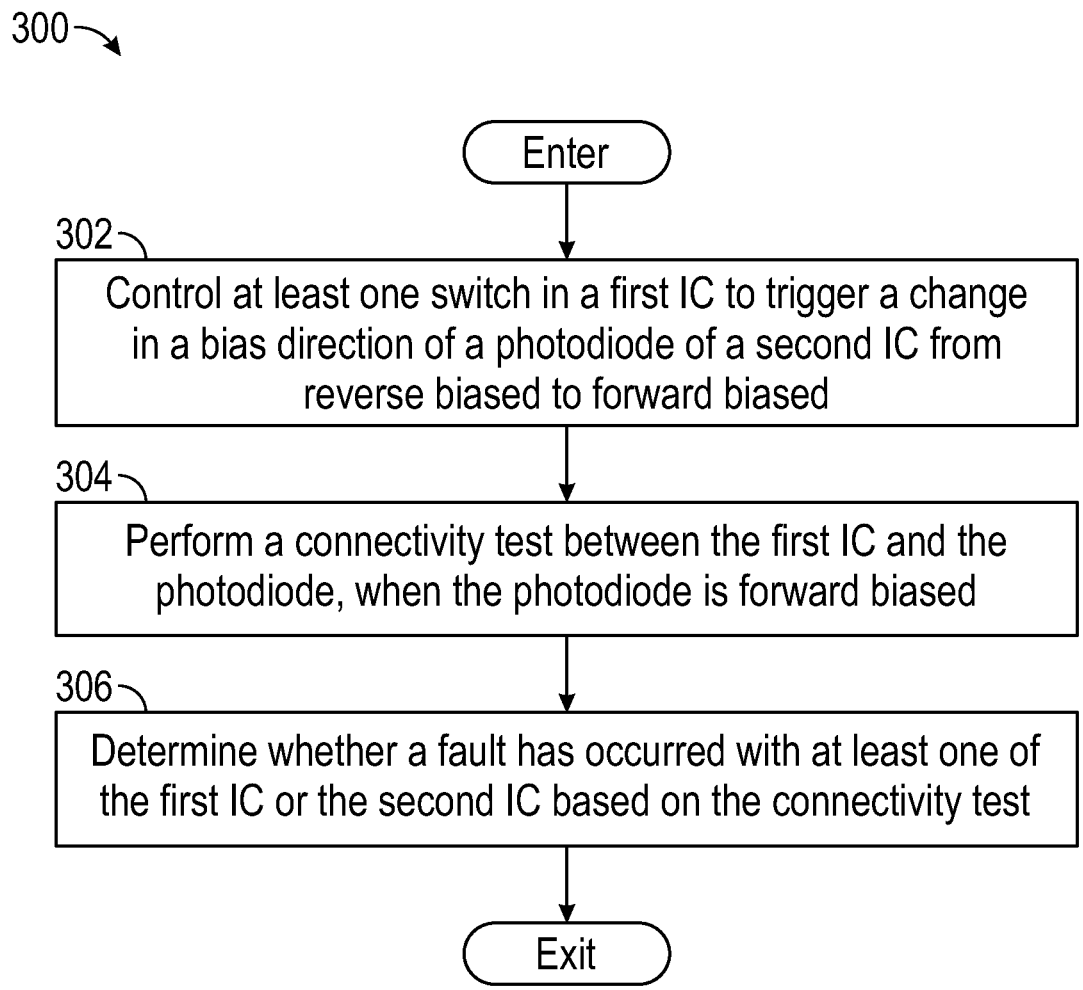
FIG. 3 is a flowchart of a method for performing connectivity testing between multiple ICs of an electronics package, according to one embodiment.

FIG. 3 is a flowchart of a method 300 for performing DC connectivity testing between multiple ICs (or chips) of an electronics package (e.g., electronics package 100), according to one embodiment. Method 300 may be performed by a measurement circuit (e.g., measurement circuitry 120). In certain embodiments, the method 300 may be performed without the use of an optical assembly. In certain embodiments, the method 300 may be performed during at least one manufacturing stage of the electronics package.

Method 300 may enter at block 302, where at least one switch (e.g., switch(es) 210, 235, 240, 245, and 250) in a first IC (e.g., IC 110) is controlled to trigger a change in a bias direction of a photodiode (e.g., photodiode 205) of a second IC (e.g., IC 105) from reverse biased to forward biased (e.g., as shown in FIG. 2B).

At block 304, a connectivity test is performed between the first IC and the photodiode, when (and while) the photodiode is forward biased. In one embodiment, the connectivity test is a BIST performed without the use of an optical assembly. In one embodiment, the connectivity test includes determining a measure of connectivity between the first IC and the photodiode while the photodiode is forward biased. The measure of connectivity may be determined by measuring a current flow through the forward biased photodiode.

At block 306, a determination is made as to whether a fault has occurred with at least one of the first IC or the second IC based on the connectivity test. For example, if there is no current (or the amount of current is less than a threshold) when the photodiode is forward biased, then the determination is that a fault has occurred with at least one of the first IC or the second IC. On the other hand, if there is current (or the amount of current is greater than (or equal to) a threshold when the photodiode is forward biased, then the determination is that a fault has not occurred with at least one of the first IC or the second IC.

Figure 4:
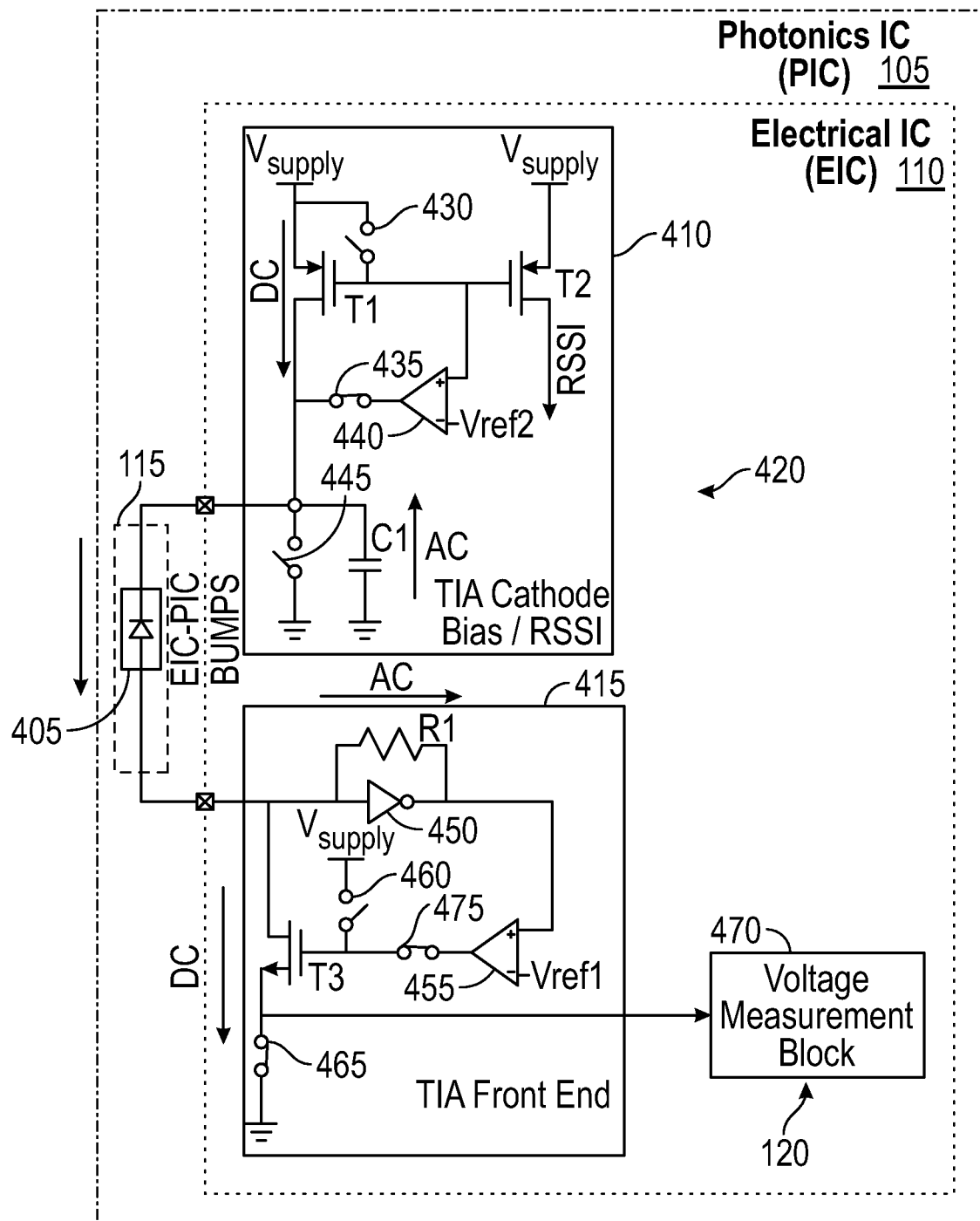
FIG. 4 further illustrates components of the electronics package, described relative to FIG. 1, in an operating mode, according to various embodiments.

FIG. 4 further illustrates components of the electronics package 100, described relative to FIG. 1, according to one embodiment. In particular, FIG. 4 illustrates components of measurement circuitry 120 (of the IC 110) and photonics circuitry 115 (of the IC 105), according to one embodiment.

In one embodiment, the measurement circuitry 120 illustrated in FIG. 4 may be configured to test connectivity between a TIA and a photodiode. For example, the measurement circuitry 120 illustrated in FIG. 4 includes a TIA block 420 and a voltage measurement block 470, and the photonics circuitry 115 includes a photodiode 405. The TIA block 420 includes a TIA circuit 410 and a TIA circuit 415, each of which may include various circuit elements, including, for example, transistors, inverters, capacitors, resistors, comparators, operational amplifiers (op amps), etc.

The TIA circuit 410 is generally configured as a TIA cathode bias circuit to control the cathode bias of the photodiode 405. Here, the TIA circuit 410 includes transistors T1-T2, switches 430, 435, and 445, capacitor C1, and an op amp 440. The TIA circuit 415 is generally configured as a TIA front end and includes transistor T3, switches 460, 465, and 475, inverter 450, resistor R1, and op amp 455. The voltage measurement block 470 may be configured to measure a voltage at the source of transistor T3.

In the embodiment depicted in FIG. 4, the measurement circuitry 120 is configured to implement a mission mode operation (e.g., normal operation) for amplifying AC current from the photodiode 405, where the AC current is representative of the modulated light incident on the photodiode 405 (e.g., the data received from an optical fiber). In mission mode operation, the switches in TIA circuit 410 and 415 may be controlled, such that the photodiode 405 is reverse biased and reverse biased photodiode current (e.g., AC+DC current) flows from the TIA circuit 410 into the TIA circuit 415.

Figure 5A:
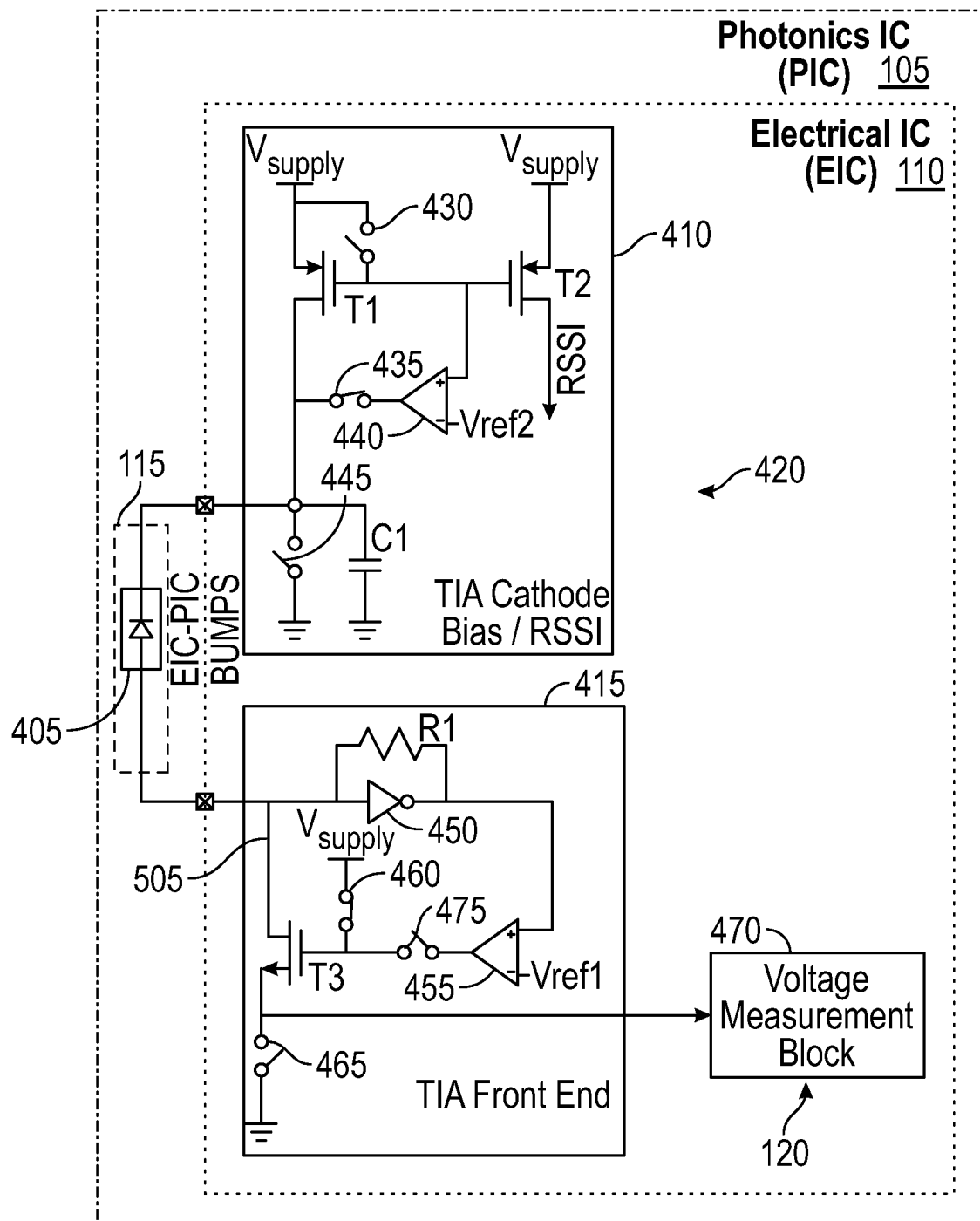
FIG. 5A further illustrates components of the electronics package, described relative to FIG. 1, configured for a first part of a connectivity test, according to various embodiments.

As opposed to using the mission mode operation, certain embodiments described herein can perform a two-part connectivity test that allows for determining connectivity without the use of optical assemblies and reduces cost compared to conventional testing approaches. FIG. 5A illustrates an example in which the measurement circuitry 120 is configured to implement a first part (or portion) of a TIA-to-photodiode connectivity test, according to one embodiment.

In contrast to the measurement circuitry 120 depicted in FIG. 4, the switches in TIA circuits 410 and 415 in FIG. 5A may be controlled (e.g., via state machine or firmware) to prevent current flow from TIA circuit 410 into TIA circuit 415 through the photodiode 405. In particular, the switches in TIA circuit 410 and 415 in FIG. 5A may be controlled to put the photodiode in reverse bias, such that no current flows into TIA circuit 415. As shown in FIG. 5A, (i) switches 430 and 445 in TIA circuit 410 and switches 475 and 465 in TIA circuit 415 are opened and (ii) switch 435 in TIA circuit 410 and switch 460 in TIA circuit 415 are closed. In certain embodiments, after controlling the switches in TIA circuits 410 and 415 to put the photodiode 405 in reverse bias with no current flow, a baseline voltage measurement may be taken at the test point 505 when there is no current flow into TIA circuit 415.

Figure 5B:
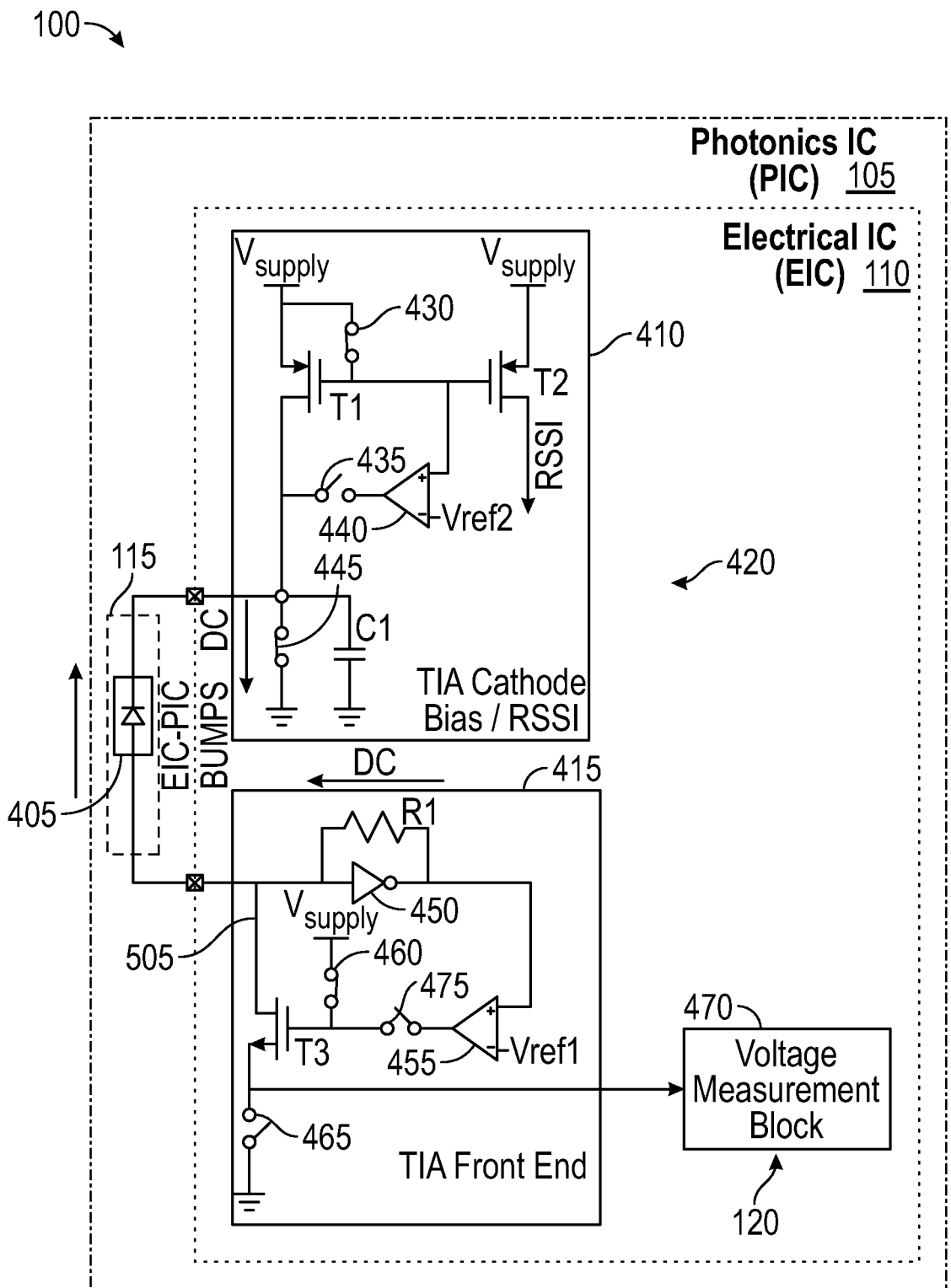
FIG. 5B further illustrates components of the electronics package, described relative to FIG. 1, configured for a second part of a connectivity test, according to various embodiments.

At a subsequent point in time, the switches in TIA circuits 410 and 415 may be controlled to allow the measurement circuitry 120 to perform a second part (or portion) of a TIA-to-photodiode connectivity test. FIG. 5B illustrates an example in which the measurement circuitry 120 is configured to implement a second part (or portion) of a TIA-to-photodiode connectivity test, according to one embodiment.

As shown, the switches in TIA circuits 410 and 415 in FIG. 5B may be controlled (e.g., via state machine or firmware), such that forward bias photodiode current (e.g., DC current) flows from the TIA input stage at the anode to ground at the cathode (e.g., from TIA circuit 415 to the photodiode 405). In particular, (i) switches 430 and 445 in TIA circuit 410 and switch 460 in TIA circuit 415 are closed and (ii) switch 435 in TIA circuit 410 and switches 465 and 475 in TIA circuit 415 are open. In certain embodiments, after controlling the switches in TIA circuits 410 and 415 to put the photodiode 405 in forward bias in this manner (e.g., current flows from anode to cathode), another voltage measurement may be taken at the test point 505.

In one embodiment, a measure of connectivity between the IC 105 and IC 110 may be determined based on both voltage measurements (e.g., the voltage measurement taken when the measurement circuitry 120 has the configuration in FIG. 5A and the voltage measurement taken when the measurement circuitry 120 has the configuration in FIG. 5B). For example, if the second (or subsequent) voltage measurement has a lower voltage than the baseline voltage measurement, this indicates a current flow and the connectivity test may pass. On the other hand, if the second (or subsequent) voltage measurement is the same as the baseline voltage measurement, this indicates no current flow and the connectivity test may fail.

Figure 6:
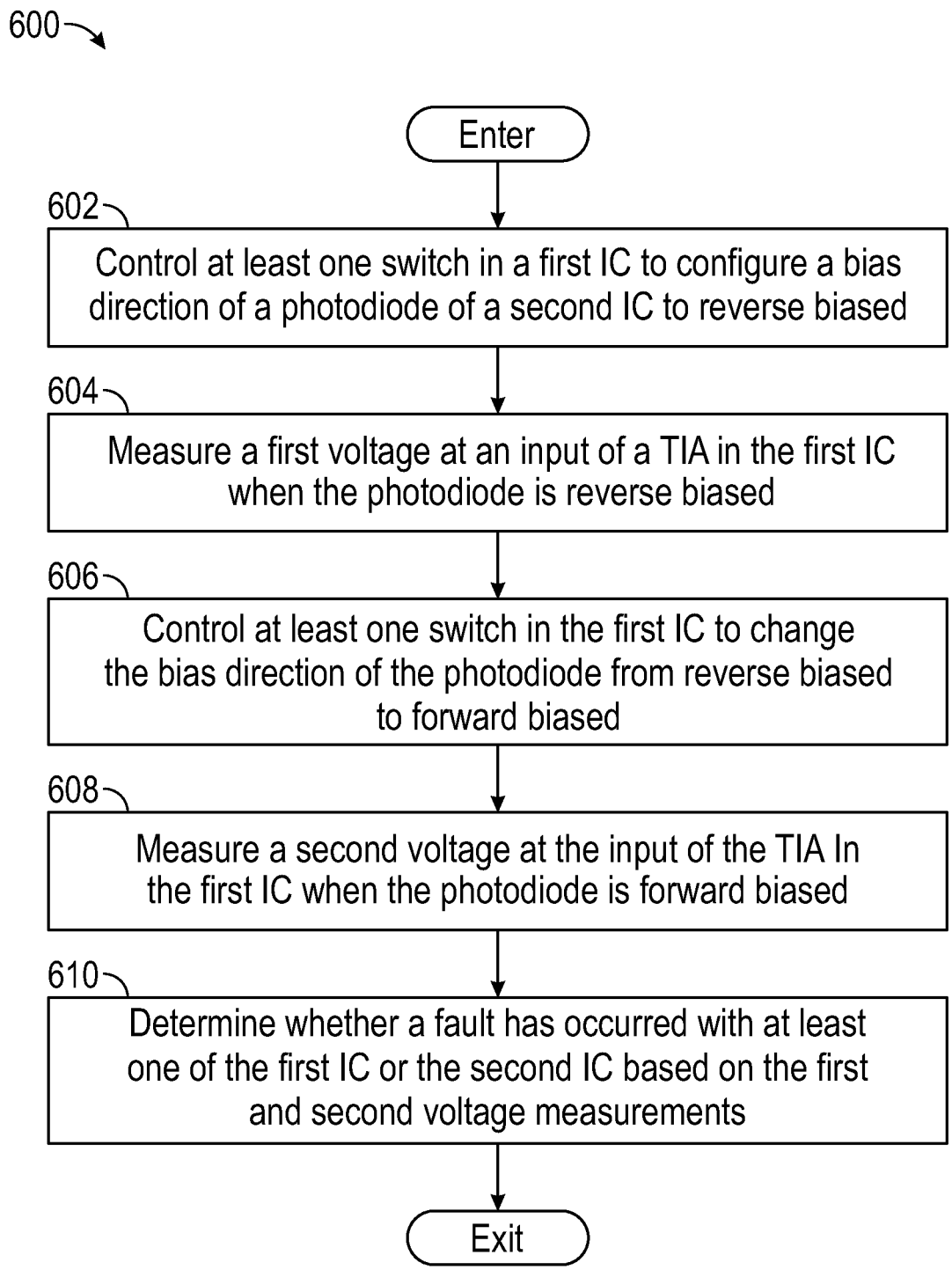
FIG. 6 is a flowchart of a method for performing connectivity testing between multiple ICs of an electronics package, according to one embodiment.

FIG. 6 is a flowchart of a method 300 for performing DC connectivity testing between multiple ICs (or chips) of an electronics package (e.g., electronics package 100), according to one embodiment. Method 600 may be performed by a measurement circuit (e.g., measurement circuitry 120). In certain embodiments, the method 600 may be performed without the use of an optical assembly. In certain embodiments, the method 600 may be performed to test connectivity between a TIA and photodiode of an electronics package.

Method 600 may enter at block 602, where at least one switch (e.g., switch(es) 430, 435, 445, 460, 465, and 475) in a first IC (e.g., IC 110) is controlled to configure a bias direction of a photodiode (e.g., photodiode 405) of a second IC (e.g., IC 105) in reverse biased (e.g., as shown in FIG. 5A). In one embodiment, at least one switch may be further controlled to configure the first IC, such that there is no current flow from the photodiode into a TIA circuit (e.g., TIA circuit 415) in the first IC.

At block 604, a first voltage is measured (e.g., via voltage measurement block 470) at an input of a TIA (e.g., TIA circuit 415) when the photodiode is reverse biased. The input of the TIA includes a node (e.g., test point 505) in the input stage of the TIA.

At block 606, at least one switch (e.g., switch(es) 430, 435, 445, 460, 465, and 475) in the first IC is controlled to change the bias direction of the photodiode from reverse biased to forward biased (e.g., as shown in FIG. 5B). In one embodiment, at least one switch may be controlled to configure the first IC, such that there is current flow from the TIA circuit (e.g., input stage of TIA circuit 415) into the photodiode 405).

At block 608, a second voltage is measured (e.g., via voltage measurement block 470) at the input of the TIA (e.g., TIA circuit 415) when the photodiode is forward biased. As noted, the input of the TIA includes a node (e.g., test point 505) in the input stage of the TIA.

At block 610, a determination is made as to whether a fault has occurred with at least one of the first IC or the second IC based on the first and second voltage measurements. For example, as noted, a difference between the first and second voltage measurements may be indicative of current flow. In this example, the determination may be that a fault has not occurred with at least one of the first IC or the second IC. In another example, if the first and second voltage measurements are the same, this may be indicative of no current flow. In such an example, the determination may be that a fault has occurred with at least one of the first IC or the second IC.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method for testing connectivity between a first integrated circuit (IC) and a second IC of an electronics package, the method comprising:
   determining a measure of connectivity between the first IC and a photodiode in the second IC when a bias direction of the photodiode is forward biased, wherein determining the measure of connectivity comprises measuring a current flow through the photodiode when the bias direction of the photodiode is forward biased; and
   determining whether there is a fault with at least one of the first IC or the second IC based on the measured current flow.

2. The method of claim 1, wherein the bias direction of the photodiode is forward biased when a switch in the first IC and coupled to a cathode of the photodiode is coupled to a reference potential node.

3. The method of claim 1, wherein:
   the bias direction of the photodiode is reverse biased when the first IC is in a first operation mode for measuring optical power incident on the photodiode in reverse bias; and
   the bias direction of the photodiode is forward biased when the first IC is in a second operation mode for measuring connectivity between the first IC and the second IC.

4. The method of claim 1, further comprising determining there is a fault when the measured current flow is below a threshold.

5. The method of claim 1, further comprising determining there is not a fault when the measured current flow is above a threshold.

6. The method of claim 1, wherein the measure of connectivity is determined via a built-in-self test and without use of an optical assembly.

7. The method of claim 1, wherein the measure of connectivity is determined during at least one manufacturing stage of the electronics package.

8. An apparatus comprising:
   a first integrated circuit (IC) comprising measurement circuitry; and
   a second IC electrically coupled to the first IC and comprising a photodiode, wherein the measurement circuitry is adapted to:
      determine a measure of connectivity between the first IC and the photodiode in the second IC when a bias direction of the photodiode is forward biased, wherein, to determine the measure of connectivity, the measurement circuitry is adapted to measure a current flow through the photodiode when the bias direction of the photodiode is forward biased; and
      determine whether there is a fault with at least one of the first IC or the second IC based on the measured current flow.

9. The apparatus of claim 8, wherein the bias direction of the photodiode is forward biased when a switch in the first IC and coupled to a cathode of the photodiode is coupled to a reference potential node.

10. The apparatus of claim 8, wherein:
    the bias direction of the photodiode is reverse biased when the first IC is in a first operation mode for measuring optical power incident on the photodiode in reverse bias; and
    the bias direction of the photodiode is forward biased when the first IC is in a second operation mode for measuring connectivity between the first IC and the second IC.

11. The apparatus of claim 8, wherein the measurement circuitry is further adapted to determine there is a fault when the measured current flow is below a threshold.

12. The apparatus of claim 8, wherein the measurement circuitry is further adapted to determine there is not a fault when the measured current flow is above a threshold.

13. The apparatus of claim 8, wherein the measure of connectivity is determined via a built-in-self test and without use of an optical assembly.

14. An electronics package comprising:
    a photonics integrated circuit (IC) comprising a photodiode; and
    an electrical IC disposed on the photonics IC and comprising measurement circuitry adapted to:
       determine a measure of connectivity between the electrical IC and the photodiode in the photonics IC when a bias direction of the photodiode is forward biased, wherein, to determine the measure of connectivity, the measurement circuitry is adapted to measure a current flow through the photodiode when the bias direction of the photodiode is forward biased; and
       determine whether there is a fault with at least one of the electrical IC or the photonics IC based on the measured current flow.

15. The electronics package of claim 14, wherein the bias direction of the photodiode is forward biased when a switch in the electrical IC and coupled to a cathode of the photodiode is coupled to a reference potential node.

16. The electronics package of claim 14, wherein:
    the bias direction of the photodiode is reverse biased when the electrical IC is in a first operation mode for measuring optical power incident on the photodiode in reverse bias; and
    the bias direction of the photodiode is forward biased when the electrical IC is in a second operation mode for measuring connectivity between the electrical IC and the photonics IC.

17. The electronics package of claim 14, wherein the measurement circuitry is further adapted to determine there is a fault when the measured current flow is below a threshold.

18. The electronics package of claim 14, wherein the measurement circuitry is further adapted to determine there is not a fault when the measured current flow is above a threshold.

19. The electronics package of claim 14, wherein the measurement circuitry is adapted to determine the measure of connectivity without use of an optical assembly.

20. The electronics package of claim 14, wherein the measurement circuitry is adapted to determine the measure of connectivity during at least one manufacturing stage of the electronics package.

* * * * *